United States Patent
Krishnaswamy

(10) Patent No.: US 9,525,392 B2
(45) Date of Patent: Dec. 20, 2016

(54) SYSTEM AND METHOD FOR DYNAMICALLY ADAPTING PLAYBACK DEVICE VOLUME ON AN ELECTRONIC DEVICE

(71) Applicant: Apple Inc., Cupertino, CA (US)

(72) Inventor: Arvindh Krishnaswamy, San Jose, CA (US)

(73) Assignee: Apple Inc., Cupertino, CA (US)

( * ) Notice: Subject to any disclaimer, the term of this patent is extended or adjusted under 35 U.S.C. 154(b) by 50 days.

(21) Appl. No.: 14/602,001

(22) Filed: Jan. 21, 2015

(65) Prior Publication Data

US 2016/0211817 A1    Jul. 21, 2016

(51) Int. Cl.
*H03G 3/02* (2006.01)

(52) U.S. Cl.
CPC .................................. *H03G 3/02* (2013.01)

(58) Field of Classification Search
CPC .............. H03G 3/02; H03G 3/20; H03G 7/00; H03G 3/24
USPC ............... 381/57, 104–109; 700/94
See application file for complete search history.

(56) References Cited

U.S. PATENT DOCUMENTS

| | | | |
|---|---|---|---|
| 7,469,051 B2 * | 12/2008 | Sapashe | H03G 3/32 379/392.01 |
| 8,081,765 B2 | 12/2011 | Yu | |
| 8,306,235 B2 | 11/2012 | Mahowald | |
| 8,403,750 B2 | 3/2013 | Bone et al. | |
| 8,600,077 B2 * | 12/2013 | Mertens | H04N 5/607 381/104 |
| 2011/0095875 A1 | 4/2011 | Thyssen et al. | |
| 2014/0328500 A1 * | 11/2014 | Patwardhan | H03G 5/16 381/107 |
| 2016/0149547 A1 * | 5/2016 | Rider | H03G 3/04 381/57 |

FOREIGN PATENT DOCUMENTS

WO    02/27985 A2    4/2002

* cited by examiner

*Primary Examiner* — Xu Mei
*Assistant Examiner* — Jason R Kurr
(74) *Attorney, Agent, or Firm* — Blakely, Sokoloff, Taylor & Zafman LLP

(57) ABSTRACT

Method of dynamically adapting playback volume on electronic device starts with processor receiving first user input and first portion of audio content. First user input signals to device to increase or decrease volume of sound output. Processor determines first loudness metric corresponding to first portion of audio content when first user input is received. First loudness metric is measure of loudness of first portion of audio content being outputted. Processor then stores in memory first loudness metric in association with first user input. Memory stores history of loudness metrics in association with user inputs. Processor then determines second loudness metric that is measure of loudness of second portion of audio content that is received and determines second user input associated with second loudness metric using history. Processor generates control signal to automatically control volume of sound output by device corresponding to second user input. Other embodiments are also described.

25 Claims, 6 Drawing Sheets

US 9,525,392 B2

SYSTEM AND METHOD FOR DYNAMICALLY ADAPTING PLAYBACK DEVICE VOLUME ON AN ELECTRONIC DEVICE

FIELD

An embodiment of the invention relate generally to a system and a method for dynamically adapting the playback volume on an electronic device. Specifically, when the system receives user inputs to increase or decrease the playback volume, the system determines the loudness metric associated with the audio content when the user input is received and stores the loudness metric with the user input (e.g., increase or decrease volume) in a memory that serves as a history of the user's playback preferences (e.g., lookup table). Using the information in memory, the system may learn the user's playback preferences with respect to the loudness metrics and automatically adjusts the volume playback by assessing the loudness metric of the audio content.

BACKGROUND

Currently, a number of consumer electronic devices are adapted to output audio signals including speech and music via speaker ports, headsets, or external loudspeakers. When playing back different types of audio content (e.g., speech, music, sound effects, etc.) over the different electronic devices, each user may have a different preference as to the volume of the type of audio content being played. For instance, some users may prefer to hear the speech in a movie to be played louder and sound effects such as explosions and gunfire to be played quieter.

Further, the environment in which the audio content is being played back may also affect the preferred loudness of the played back content. For instance, in a noisy room or noisy car, the user may wish to increase the peak loudness of the audio being played back whereas in a public place or late at night in a quiet space, the user may wish to limit the peak loudness of the audio being played back.

While the user is currently able to manually adjust the volume control knob to change the loudness of the playback, the user does not have direct control over the dynamic range of the audio being played back. Accordingly, the user is not able to set a preferred playback volume for each type of audio content or loudness metric or environment. Instead, the user has to adjust the volume manually in real time to suit his preferences.

SUMMARY

Generally, the invention relates to a system and method of dynamically adapting the playback volume on an electronic device. More specifically, the adaptation may be based on a history of user volume control inputs associated with the loudness metrics of an audio content at the time of the user volume control inputs were received. The adaptation may also be based on the ambient noise that is used to refine the loudness metric. Accordingly, the system may learn from the user's real time volume control choices with respect to the loudness of the playback content and/or the ambient noise in the environment and infer from this data the ideal dynamic range for the audio content being played back.

In one embodiment of the invention, a method of dynamically adapting the playback volume on an electronic device starts with a processor receiving a first user input and a first portion of an audio content. The first user input signals to an electronic device to increase or to decrease a volume of a sound output. The processor then determines a first loudness metric corresponding to the first portion of the audio content when the first user input is received. The first loudness metric is a measure of the loudness of the first portion of the audio content being outputted by the electronic device. The processor may determine the first loudness metric by reading the first loudness metric included in a metadata associated with the first portion of the audio content. The processor then stores in a memory the first loudness metric in association with the first user input. The memory may store a history of loudness metrics in association with user inputs. The processor then determines a second loudness metric that is a measure of the loudness of a second portion of the audio content that is received and determines a second user input associated with the second loudness metric using the history. The processor may determine the second loudness metric by reading the second loudness metric included in a metadata associated with the second portion of the audio content. The processor generates a control signal to automatically control the volume of the sound output by the electronic device corresponding to a second user input. The processor may dynamically adjust the volume of the sound being output in real time. In one embodiment, the processor may also receive a microphone signal from a microphone in a vicinity of the user and analyze the microphone signal to refine the first loudness metric.

In one embodiment, a non-transitory computer-readable storage medium having stored thereon instructions, which when executed by a processor, causes the processor to perform the method of dynamically adapting the playback volume on an electronic device.

In another embodiment, a system of dynamically adapting the playback volume on an electronic device includes a user interface, a memory, and a processor. The user interface receives a first user input that signals to an electronic device to increase or decrease a volume of a sound output. The memory stores a history of loudness metrics in association with user inputs. The processor receives the first user input and a first portion of an audio content and determines a first loudness metric corresponding to the first portion of the audio content when the first user input is received. The first loudness metric is a measure of the loudness of the first portion of the audio content being outputted by the electronic device. The processor stores in a memory the first loudness metric in association with the first user input. The processor determines a second loudness metric that is a measure of the loudness of a second portion of the audio content that is received and determines a second user input associated with the second loudness metric using the history. The processor also generates a control signal to automatically control the volume of a sound output by the electronic device corresponding to a second user input.

The above summary does not include an exhaustive list of all aspects of the present invention. It is contemplated that the invention includes all systems, apparatuses and methods that can be practiced from all suitable combinations of the various aspects summarized above, as well as those disclosed in the Detailed Description below and particularly pointed out in the claims filed with the application. Such combinations may have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. In the drawings.

DETAILED DESCRIPTION

In the following description, numerous specific details are set forth. However, it is understood that embodiments of the invention may be practiced without these specific details. In other instances, well-known circuits, structures, and techniques have not been shown to avoid obscuring the understanding of this description.

Figure 1:
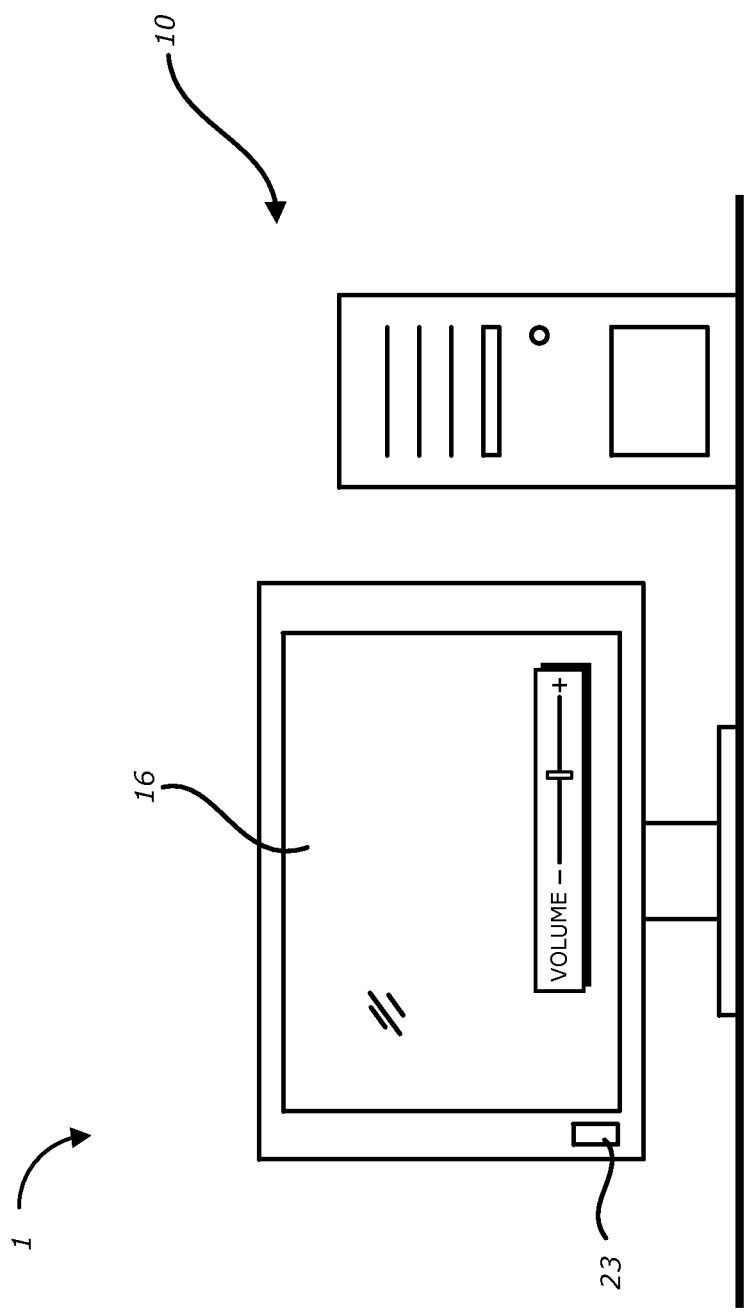
FIG. 1 illustrates a system including an example of a consumer electronic device in which an embodiment of the invention may be implemented.

FIG. 1 illustrates a system 1 including an instance of a consumer electronic device 10 in which an embodiment of the invention may be implemented. As shown in FIG. 1, the electronic device 10 is a desktop computer including a display device 16.

The electronic device in FIG. 1 comprises a housing that includes a display screen 16 on the front face of the device 10 to display the visual part of an audio-visual content and speaker ports 23 to output sound corresponding to the audio part of the audio-visual content. The electronic device 10 may also receive a volume selection input from the user (e.g., via a mouse or a keyboard used to navigate the user interface on the display screen 16). For example, the user may increase the volume from a current volume selection input (e.g., level 5/16) to a higher volume selection input (e.g., level 6/16) or the user may decrease the volume from the current volume selection input (e.g., level 5/16) to a lower volume selection input (e.g., level 4/16). The display screen 16 may be used to display the current volume selection input on a user input scale (e.g., from 0/16 to 16/16) as it is being adjusted. The system 1 in FIG. 1 may also include microphones in the vicinity of the user that are communicatively coupled with the electronic device 10. The microphones (not shown) may be air interface sound pickup devices that convert sound into an electrical signal. The microphones may be used to capture the audio signals that are heard by the user such that the microphones may be used to determine or refine the loudness metric associated with an audio content as well as the ambient noise level.

Figure 2:
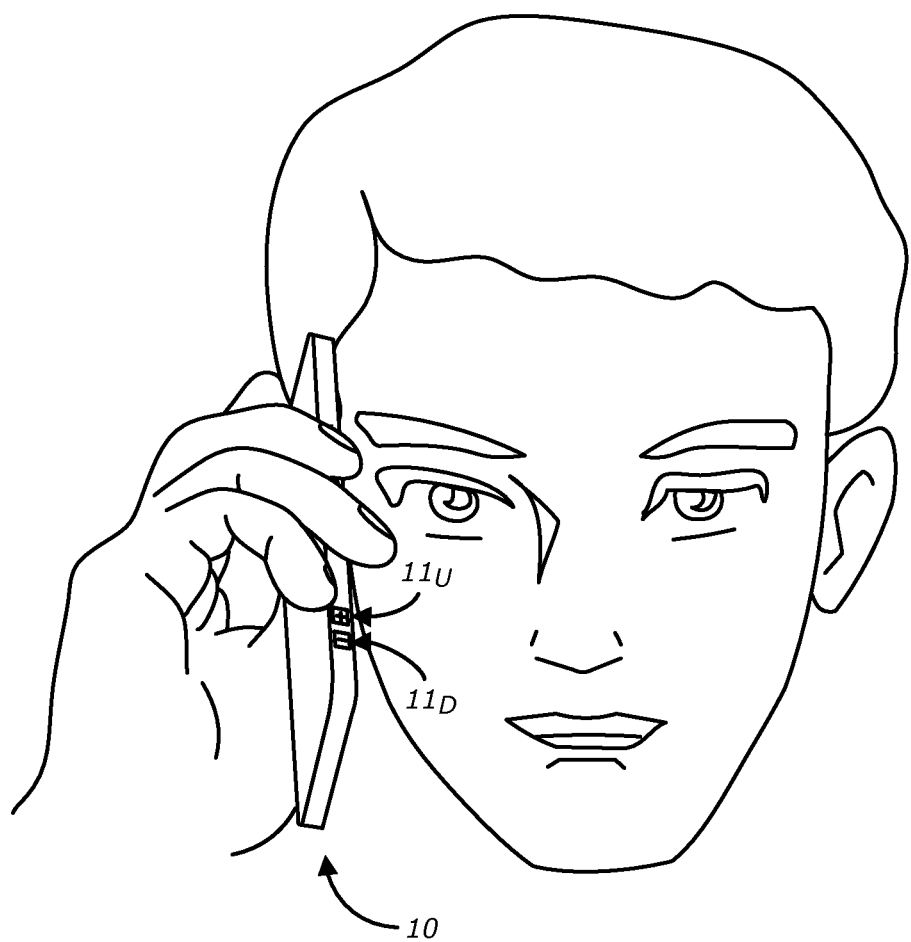
FIG. 2 illustrates another example of a consumer electronic device in which an embodiment of the invention may be implemented.

FIG. 2 illustrates another instance of a consumer electronic device in which an embodiment of the invention may be implemented. As shown in FIG. 2, the electronic device 10 may be a mobile telephone communications device (or mobile device) or a smartphone.

Similar to FIG. 1, the device 10 in FIG. 2 may include a housing that includes a display screen 16 on the front face of the device 10. The display screen 16 may also include a touch screen. Device 10 may also include one or more physical buttons and/or virtual buttons (on the touch screen). The one or more physical buttons and/or virtual buttons may include button $11_U$ and button $11_D$ used to receive a volume selection input from the user. In other embodiments, rather than being physical buttons, the buttons $11_U$, $11_D$ may also be virtual buttons that are displayed on the display screen and may be activated by the user via the touch screen. For example, the button $11_U$ may be used to increase the volume from a current volume selection input (e.g., level 5/16) to a higher volume selection input (e.g., level 6/16) and the button $11_D$ may be used to decrease the volume from the current volume selection input (e.g., level 5/16) to a lower volume selection input (e.g., level 4/16). The display screen 16 may be used to display the current volume selection input on a user input scale (e.g., from 0/16 to 16/16) as it is being adjusted using the buttons $11_U$, $11_D$.

Device 10 may also include input-output components such as ports and jacks. For example, the device 10 may include a first opening to form the microphone port and a second opening to form a speaker port. The sound during a telephone call is emitted through a third opening which forms a speaker port for a telephone receiver that is placed adjacent to the user's ear during a call. Further, when the device is used in speakerphone mode, for example, the openings may be used as speaker ports to output the audio signals. When the user is using the device 10 to listen to audio content or to view audio-visual content, the sound corresponding to the audio content or the audio portion of the audio-visual content may be output from the speaker ports. In some embodiments, the user may use a headset that includes a pair of earbuds and a headset wire. The user may place one or both the earbuds into his ears to receive the audio content. The headset wire may also include a plurality of microphones. Additionally, embodiments of the invention may also use other types of headsets.

The electronic device 10 may also be, for instance, a desktop computer (as shown in FIG. 1), a tablet computer, a personal digital media player, a notebook computer, or a laptop computer. In one embodiment, the electronic device 10 may be adapted to receive transmissions from any content provider. An example of a "content provider" may include a company providing content for download over the Internet or other Internet Protocol (IP) based networks like an Internet service provider. In addition, the transmissions from the content providers may be a stream of digital content that is configured for transmission to one or more digital devices for viewing and/or listening. According to one embodiment, the transmission may contain MPEG (Moving Pictures Expert Group) compliant compressed video. A "scene" in the digital content may be generally defined as one or more frames of content, namely one or more frames video, one or more still images, or any combination thereof. For instance, as an example, a scene may include fifteen (15) consecutive frames of video. The electronic device may also be coupled to a digital media player (e.g., DVD player) to receive and display the digital content for viewing and/or listening.

Figure 3:
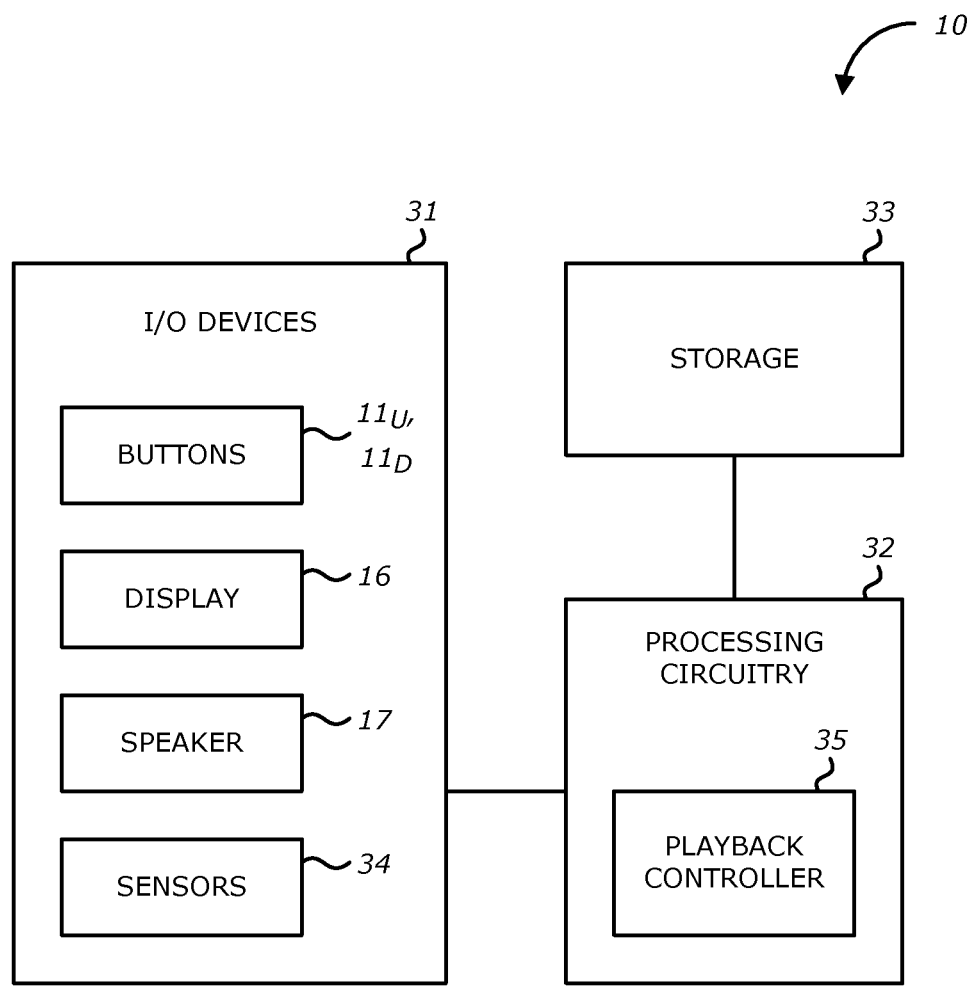
FIG. 3 illustrates a block diagram of an electronic device in which an embodiment of the invention may be implemented.

FIG. 3 illustrates a block diagram of an electronic device to dynamically adapt a playback volume according to one embodiment of the invention. As shown in FIG. 3, the electronic device 10 includes an input-output devices 31, processing circuitry 32, and storage 33.

Input-output devices 31 allow the device 10 to receive data as well as provide data. In one embodiment, input-output devices 31 may include the display screen 16, audio devices such as a speaker 17, and sensors 34, and user input-output devices. Using the user input-output devices, the user may supply commands to control the operations of the device 10. In one embodiment, the user input-output devices 40 include the display screen 16, the buttons, a microphone port, a speakerphone or loudspeaker port, and an earpiece speaker port (used as a close to the ear receiver port). As discussed above, the user may use a button $11_U$ to increase the volume from a current volume selection input to a higher volume selection input and may use a button $11_D$ to decrease the volume from the current volume selection input to a lower volume selection input.

Input-output devices 31 may include display 16 and audio devices such as speaker 17 that may contain audio-video interface equipment such as jacks and other connectors for external devices. The speaker 17 may be used to output audio signals at the current volume selection input. The input-output devices 31 may also include sensors 34 that are adapted to detect the ambient noise level surrounding the device 10. In one embodiment, the input-output devices 31 includes at least one microphone that is used to determine and/or refine the loudness metric and the ambient noise level.

While not shown, input-output devices 31 may also include wireless communications devices having communications circuitry such as radio frequency (RF) transceiver circuitry, antennas, etc. . . . In one embodiment, the microphone port, the speaker ports may be coupled to the communications circuitry to enable the user to participate in wireless telephone or video calls. A variety of different wireless communications networks and protocols may be supported in the wireless communications devices 44. These include: a cellular mobile phone network (e.g. a Global System for Mobile communications, GSM, network), including current 2G, 3G and 4G networks and their associated call and data protocols; and an IEEE 802.11 data network (WiFi or Wireless Local Area Network, WLAN) which may also support wireless voice over internet protocol (VOIP) calling. In one embodiment, the input-output devices 31 receive via the wireless communications devices audio content or audio-visual content and metadata associated with the content. The metadata may be embedded in the audio or audio-visual content or the metadata may be included in a metadata channel that is separate from the content.

The processing circuitry 32 included in device 10 may include a processor, such as a microprocessor, a microcontroller, a digital signal processor, or a central processing unit, and other needed integrated circuits such as glue logic. The term "processor" may refer to a device having two or more processing units or elements, e.g. a CPU with multiple processing cores. The processing circuitry 32 may be used to control the operations of device 10 by executing software instructions or code stored in the storage 33. The storage 33 may include one or more different types of storage such as hard disk drive storage, nonvolatile memory, and volatile memory such as dynamic random access memory. In some cases, a particular function as described below may be implemented as two or more pieces of software in the storage 33 that are being executed by different hardware units of a processor. The storage 33 may also be used to store a history of loudness metrics in association with user volume selection inputs as further discussed below.

The processing circuitry 32 (or simply processor) may include a playback controller 35 to dynamically adapt the playback volume on the electronic device 10 as described below. In other embodiments, the processor 32 may be programmed by the playback controller 35 (in the storage 33) to dynamically adapt the playback volume on the electronic device 10 as described below. The processor 32 may also execute software stored in the storage 33 that uses the wireless communications functionality of the device 10 to initiate an outgoing call and/or send a Short Message Services, SMS, text message, and to establish a TCP/IP connection (over a wireless link) with a remote server over the Internet.

In one embodiment, the processing circuitry 32 may receive an audio content and the user volume input selection from the buttons $11_U$, $11_D$ and perform an analysis of the audio content to determine an associated loudness metric with respect to the user's volume input selection. The associated loudness metric may be determined by reading the metadata associated with the respective portion of the audio content as further described below. The playback controller 35 infers the user's volume preference with regards to a loudness of an audio content. For instance, if the user is watching an action movie and the current audio content includes explosions, the user decreasing the volume of the audio content via the button $11_D$ indicates to the playback controller 35 that the user prefers a decreased audio output during very loud scenes. The playback controller 35 may determine the loudness of the scenes based on the loudness metrics included in the metadata associated with the scenes. In another embodiment, the processing circuitry 32 also receives an ambient noise level from the sensors 34 and performs a further analysis of that ambient noise level, as described below. For example, the ambient noise level may be analyzed through an artificial intelligence process or in the other ways described herein. As a result of that analysis, the processing circuitry 32 may then dynamically adapt the playback volume as described below.

Figure 4:
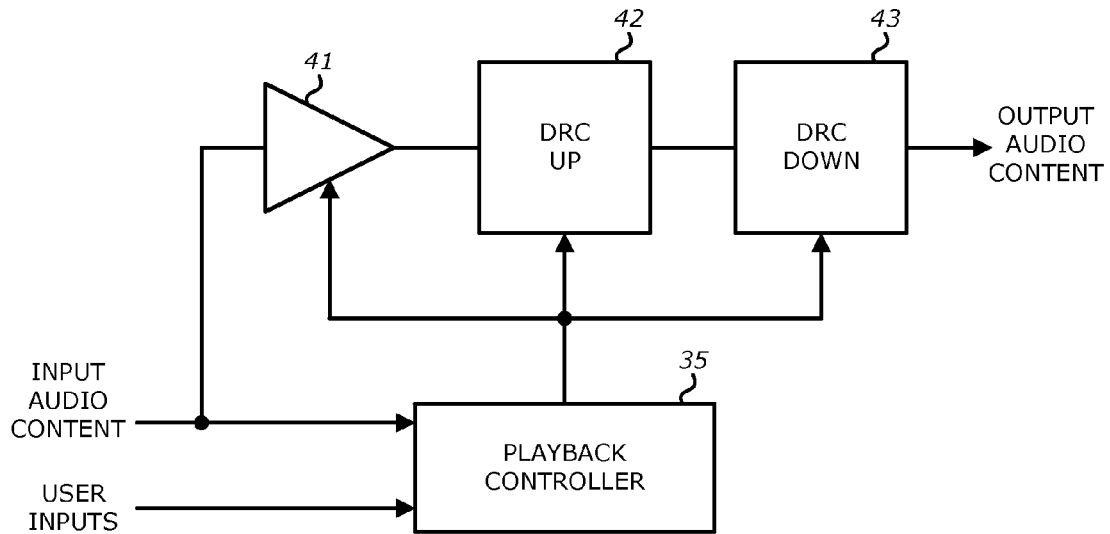
FIG. 4 illustrates a block diagram of a playback controller of the electronic device in FIG. 3 in which an embodiment of the invention may be implemented.

FIG. 4 illustrates a block diagram of a playback controller 35 of the electronic device 10 in FIG. 3 in which an embodiment of the invention may be implemented.

The playback controller 35 receives the audio content and the user volume selection inputs. For instance, the playback controller 35 may receive a first portion of the audio content and a first user input that signals to an electronic device to increase (e.g., button $11_U$) or to decrease (e.g., button $11_D$) a volume of a sound output. The playback controller 35 determines a first loudness metric corresponding to the first portion of the audio content when the first user input is received. The first loudness metric is a measure of the loudness of the first portion of the audio content that is established by analyzing a sound strength of the first portion of the audio content. For example, the sound strength of a portion of the audio content is high when the portion of the audio content includes loud speech, loud background sound effects, or loud background music and the sound strength of the portion of the audio content is low when the portion of the audio content includes no sound, quiet speech, or soft background music.

In one embodiment, the loudness metric associated with the portion of audio content is included in the embedded metadata of the audio content. The metadata portion is associated with the portion of audio content and describes the associated audio content. The metadata can include information that is used by the playback controller 35 to control, for example, the dialogue level, DRC, any downmixing of the decoded audio content, to dynamically adapt the playback by the electronic device 10. In this embodiment, the playback controller 35 determines the associated loudness metric by reading the loudness metric from the embedded metadata included in the audio content. In other embodiments, in lieu of being embedded in the audio content, the metadata including the loudness metric is received by the playback controller 35 via a metadata channel that is separate from the audio content. The various loudness metrics that is contained in the metadata may include at least one of: program loudness (e.g., a subjective loudness measure of an entire audio program such as computed in accordance with ITU BS.1770), a true peak value (e.g., measured in accordance with ITU BS.1770), anchor loudness, loudness range, top of loudness range, maximum momentary loudness, and short term loudness. This metadata may also include an index of the DRC characteristic that has been selected to generate DRC gain values for the input audio signal, which DRC gain values may also be included in the metadata.

For instance, the user may activate the button $11_D$ to decrease the volume of the sound output during an action movie scene with explosions (e.g., first portion of audio content). In this example, the playback controller 35 determines the loudness metric associated with the action movie scene with explosions (e.g., the loudness metric being the top of the loudness range at 95 decibels), which is the portion of the audio content that was being played back when the user activated the button $11_D$. The playback controller 35 stores in memory 33 the first loudness metric in association with the user's input (e.g., activates button $11_D$ to decreases the volume of the playback). The memory 33 may thus store a history of loudness metrics in association with user inputs. For example, the history may include the top of the loudness range (e.g., loudness metric) at 95 decibels in association with a decrease in volume of sound output from, for example, user input selection level 7/16 to 6/16. In some embodiments, the memory 33 as a user input at least one of: an indication of an increase or decrease (e.g., activation of button $11_U$ or button $11_D$), the amount of decrease/increase in playback volume inputted by the user, the final volume selection input by the user (e.g., 6/16 volume level).

When the playback controller 35 receives subsequent portions of the audio content, the playback controller 35 may automatically determine the loudness metrics associated with each of the subsequent portions and consult the history stored in the memory 33 to determine whether an increase or a decrease in the default playback volume output is needed. For instance, if the playback controller 35 determines that a second loudness metric indicates further action scenes with explosions (e.g., the loudness metric being the top of the loudness range at 95 decibels), the playback controller 35 can infer based on the history in memory 33 that the user input desired would be to activate the button $11_D$ to decrease the playback volume of the audio content. Accordingly, the playback controller 35 may automatically decrease the playback volume for the user based on this determination that subsequent action scenes with explosions should be played at a lower volume than the default volume of the sound output. In some embodiments, the playback controller 35 determines the current volume setting of the electronic device 10 and consults the data stored in the history with respect to the current loudness metric (e.g., the second loudness metric). If the current volume setting of the device 10 is greater than the final volume selection input by the user that is stored in the history with respect to the second loudness metric (e.g., the loudness metric being the top of the loudness range at 95 decibels), the playback controller 35 decreases the volume of sound output by decreasing the current volume setting to match the final volume selection input as stored in the history.

Similarly, if the history stored in memory 33 indicates that the user has previously increased the volume during a quieter scene (e.g., scene with whispered speech where the loudness metric is the maximum momentary loudness at 45 decibels), the playback controller 35 will automatically increase the playback volume of subsequent scenes having similar loudness metrics (e.g., the maximum momentary loudness at 45 decibels). The playback controller 35 may generate control signals to automatically control the volume of the sound output by the electronic device corresponding to the inferred desired user input.

Figure 5:
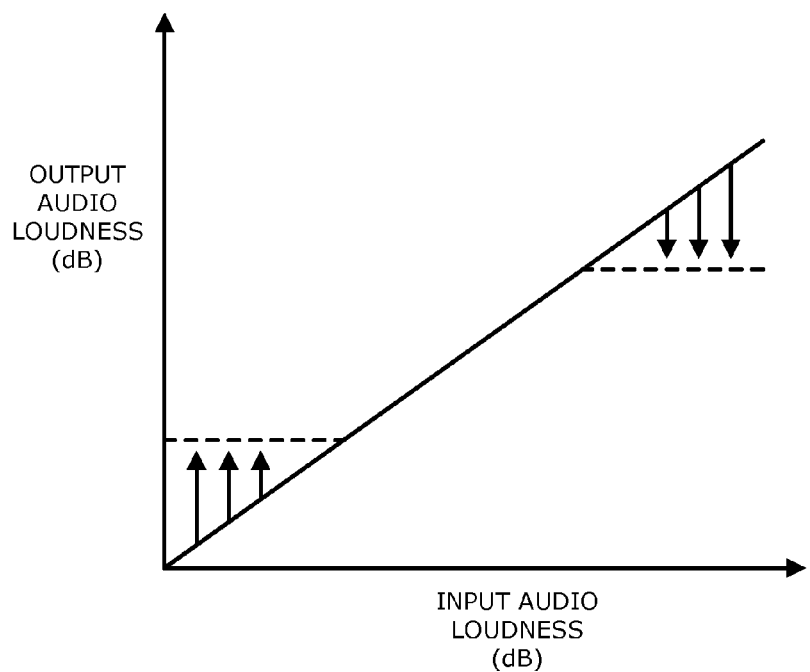
FIG. 5 is a graph of illustrating the adaptation of the playback of an electronic device according to one embodiment of the invention.

As shown in FIG. 4, the playback controller 35 generates control signals that are transmitted to at least one of: an amplifier 41, an upwards dynamic range compression (DRC) controller ("DRC up") 42, and a downwards dynamic range compression (DRC) controller ("DRC down") 43. In one embodiment, the control signal causes the amplifier 41 applies a gain to the audio content. The control signal may also indicate the amount of gain to be applied by the amplifier 41. In one embodiment, the control signal may also cause DRC up 42 to increase the loudness of sounds below a certain threshold and cause the DRC down 43 to reduce the loud sounds over a certain threshold. Both the DRC up 42 and DRC down 43 narrow or "compress" the dynamic range of the input audio signal as shown in FIG. 5. The DRC up 42 and DRC down 43 may be a compressor which is an electronic hardware unit or an audio software used to apply compression. The control signals generated by the playback controller 35 to the DRC up 42 and DRC down 43 may include a threshold (e.g., in dB, sone, etc.), a ratio or amount of gain reduction (gain value), attack and release controls that vary the rate at which compression is applied and smooth the effect, and a hard and/or soft knee control. FIG. 5 is a graph of illustrating the adaptation of the playback of an electronic device according to one embodiment of the invention. The graph shows that the loudness of input audio (x-axis) in sone or in dB may be dynamically adapted such that the loudness of output audio (y-axis) in sone or in dB is increased or decreased (shown as dashed lined) based on control signals from the playback controller 35. The playback controller 35 based on an analysis of the input audio content and the user's input may establish the thresholds for the DRC up 42 and DRC down 43. For instance, if during the scenes with explosions the user decreases the volume of the sound being outputted, the playback controller 35 can determine the loudness of the scenes with the explosions (e.g., the loudness metric being the short term loudness of 95 dB) and set that level of loudness to be the threshold for the DRC down 43. The playback controller 35 may generate a control signal that indicates to the DRC down 43 to decrease the loud sounds equal or over the set threshold (e.g., the loudness metric being the short term loudness of 95 dB). In some embodiments, the loudness metric being the short term loudness of 95 dB is stored in the history in memory 33 in association with a user input reflecting a decrease in the volume of sound output. The history stored in memory 33 is a lookup table for the playback controller 35 to adaptively learn the user's volume output preferences. In some embodiments, the playback controller 35 uses the second loudness metric calculated based on the data from the metadata, determines the desired loudness based on the corresponding user input stored in the history in memory 33, and generates a control signal that includes a gain that based on the loudness metric (e.g., the measured loudness) and the desired loudness. In one embodiment, the control signal may include a gain that is a ratio of the loudness metric (e.g., the measured loudness) and the desired loudness.

In some embodiments, the playback controller 35 can adjust the playback of audio content using at least one of the loudness metric included in the metadata, index of DRC characteristic included in the metadata, the DRC gain values included in the metadata, as well as the loudness metrics in association with the user inputs stored in the history in memory 33. Thus, the dynamic adjustment of the playback of audio content can be achieved in real-time during playback processing. In one embodiment, the second loudness metric associated with the second portion of the audio content is read by the playback controller 35, when decoding the audio file or stream, and is used to automatically adjust the loudness of the decoded audio content based on the user's preferences inferred from the history stored in memory 33.

In some embodiments, the system to dynamically adapt a playback volume of an electronic device 10 further includes a microphone in a vicinity of the user to generate a microphone signal. The playback controller 35 may analyze the microphone signal to refine the loudness metric associated with a portion of the audio content and to determine an ambient noise level associated with that portion of audio content. The playback controller 35 may update the history in the storage 33 by storing the refined loudness metric associated with the portion of the audio content. In some embodiments, the ambient noise level may also be stored in the history in the storage 33 and associated with that portion of audio content. Using the ambient noise level, the playback controller 35 may also determine the user's preference and generate a control signal according for subsequent portions of audio content. For instance, the user that is watching the scene with explosions (e.g., the loudness metric being the short term loudness of 95 dB) in a quiet room may decrease the volume to level 4/16, while the user that is watching the scene with explosions in a louder room may decreases the volume to 5/16. The playback controller 35 can store the ambient noise levels (e.g., quiet room vs. louder room) in the storage 33 for future reference. Accordingly, for the subsequent portions of audio content, when the playback controller 35 determines a loudness metric that is equivalent to the explosions scene (e.g., the loudness metric being the short term loudness of 95 dB), the playback controller 35 may further determine the current ambient noise level from the sensors 34 and refer to the history in the storage 33 to determine the appropriate volume output level.

Moreover, the following embodiments of the invention may be described as a process, which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, etc.

Figure 6:
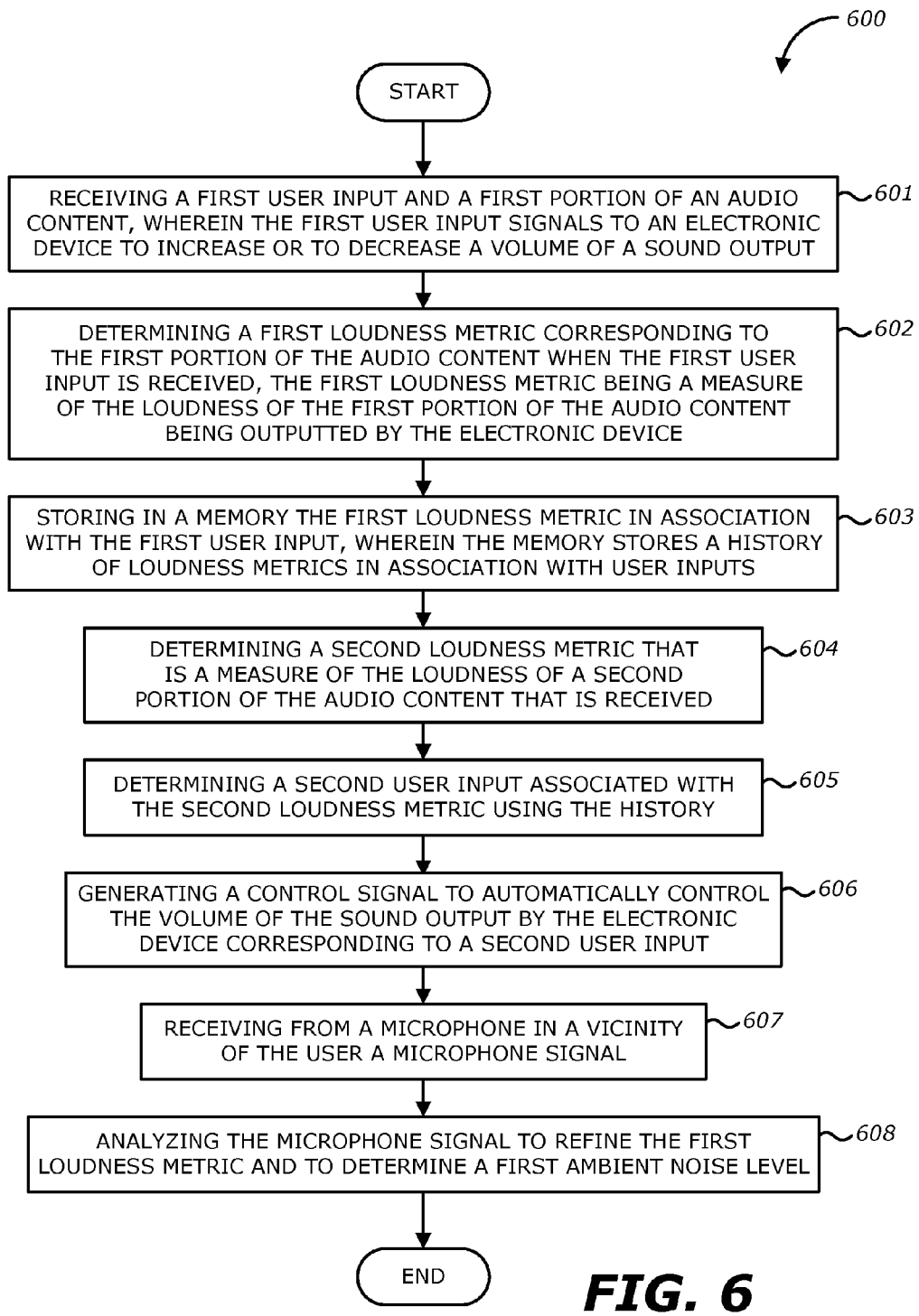
FIG. 6 illustrates a flow diagram of an example method for dynamically adapting the playback volume on an electronic device according to an embodiment of the invention.

FIG. 6 illustrates a flow diagram of an example method for dynamically adapting the playback volume on an electronic device according to an embodiment of the invention. The method 600 starts at Block 601 with the processor receiving a first user input and a first portion of an audio content. The first user input may signal to an electronic device to increase or to decrease a volume of a sound output. The first user input may be received from a user input device having a user interface. The user input device may be a touch screen, a button, a remote control device, etc. At Block 602, the processor determines a first loudness metric corresponding to the first portion of the audio content when the first user input is received. The first loudness metric may be a measure of the loudness of the first portion of the audio content being outputted by the electronic device. In one embodiment, the processor may determine the first loudness metric by analyzing a sound strength of the first portion of the audio content. In one embodiment, the processor determines the first loudness metric by reading the first loudness metric included in a metadata associated with the first portion of the audio content. The metadata may be embedded in the audio content or may be included in a metadata channel that is separate from the audio content. At Block 603, the processor stores in a memory the first loudness metric in association with the first user input. The memory may store a history of loudness metrics in association with user inputs. At Block 604, the processor determines a second loudness metric that is a measure of the loudness of a second portion of the audio content that is received. The second portion of the audio content may be a portion of audio content that is subsequent to the first portion of audio content. In one embodiment, the processor determines the second loudness metric by analyzing a sound strength of the second portion of the audio content. In one embodiment, the processor determines the second loudness metric by reading the second loudness metric included in a metadata associated with the second portion of the audio content. The metadata may be embedded or separate from the audio content. At Block 605, the processor determines a second user input associated with the second loudness metric using the history and at Block 606, the processor generates a control signal to automatically control the volume of the sound output by the electronic device corresponding to a second user input. The second user input is an input that is inferred to likely be received from the user in light of the second loudness metric associated with the second portion of audio content. In some embodiments, the processor receives from a microphone in a vicinity of the user a microphone signal at Block 607. At Block 608, the processor analyzes the microphone signal to refine the first loudness metric and to determine the first ambient noise level.

Figure 7:
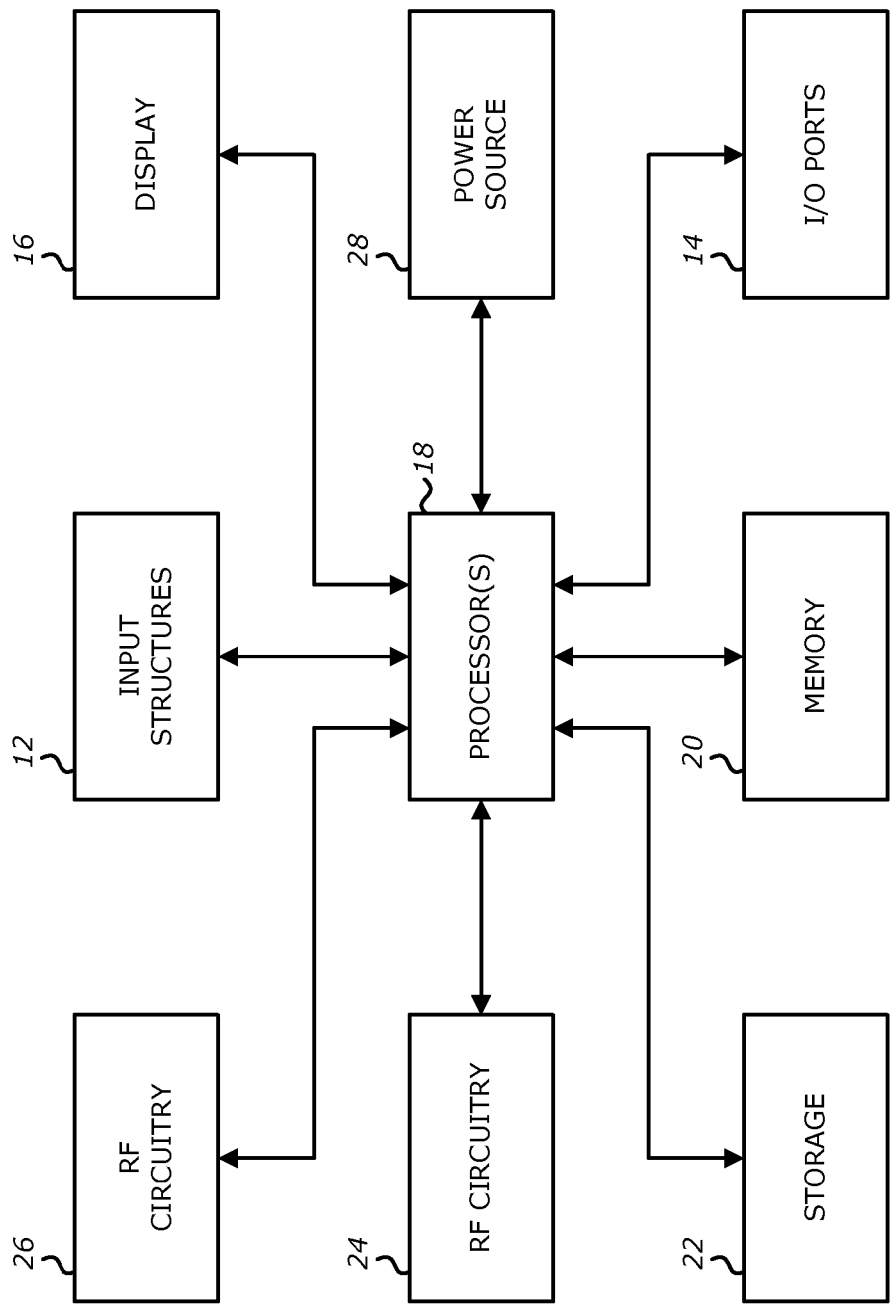
FIG. 7 is a block diagram of exemplary components of an electronic device in accordance with aspects of the present disclosure.

A general description of suitable electronic devices for performing these functions is provided below with respect to FIG. 7. Specifically, FIG. 7 is a block diagram depicting various components that may be present in electronic devices suitable for use with the present techniques. The electronic device may be in the form of a computer, a handheld portable electronic device, and/or a computing device having a tablet-style form factor. These types of electronic devices, as well as other electronic devices providing comparable speech recognition capabilities may be used in conjunction with the present techniques.

Keeping the above points in mind, FIG. 7 is a block diagram illustrating components that may be present in one such electronic device 10, and which may allow the device 10 to function in accordance with the techniques discussed herein. The various functional blocks shown in FIG. 7 may include hardware elements (including circuitry), software elements (including computer code stored on a computer-readable medium, such as a hard drive or system memory), or a combination of both hardware and software elements. It should be noted that FIG. 7 is merely one example of a particular implementation and is merely intended to illustrate the types of components that may be present in the electronic device 10. For example, in the illustrated embodiment, these components may include a display 16, input/output (I/O) ports 14, input structures 12, one or more processors 18, memory device(s) 20, non-volatile storage 22, expansion card(s) 24, RF circuitry 26, and power source 28.

In the embodiment of the electronic device 10 in the form of a computer, the embodiment include computers that are generally portable (such as laptop, notebook, tablet, and handheld computers), as well as computers that are generally used in one place (such as conventional desktop computers, workstations, and servers).

The electronic device 10 may also take the form of other types of devices, such as mobile telephones, media players, personal data organizers, handheld game platforms, cameras, and/or combinations of such devices. For instance, the device 10 may be provided in the form of a handheld electronic device that includes various functionalities (such as the ability to take pictures, make telephone calls, access the Internet, communicate via email, record audio and/or video, listen to music, play games, connect to wireless networks, and so forth).

In another embodiment, the electronic device 10 may also be provided in the form of a portable multi-function tablet computing device. In certain embodiments, the tablet computing device may provide the functionality of media player, a web browser, a cellular phone, a gaming platform, a personal data organizer, and so forth.

An embodiment of the invention may be a machine-readable medium having stored thereon instructions which program a processor to perform some or all of the operations described above. A machine-readable medium may include any mechanism for storing or transmitting information in a form readable by a machine (e.g., a computer), such as Compact Disc Read-Only Memory (CD-ROMs), Read-Only Memory (ROMs), Random Access Memory (RAM), and Erasable Programmable Read-Only Memory (EPROM). In other embodiments, some of these operations might be performed by specific hardware components that contain hardwired logic. Those operations might alternatively be performed by any combination of programmable computer components and fixed hardware circuit components. In one embodiment, the machine-readable medium includes instructions stored thereon, which when executed by a processor, causes the processor to perform the method for dynamically adapting the playback volume on an electronic device as described above.

In the description, certain terminology is used to describe features of the invention. For example, in certain situations, the terms "component," "unit," "module," and "logic" are representative of hardware and/or software configured to perform one or more functions. For instance, examples of "hardware" include, but are not limited or restricted to an integrated circuit such as a processor (e.g., a digital signal processor, microprocessor, application specific integrated circuit, a micro-controller, etc.). Of course, the hardware may be alternatively implemented as a finite state machine or even combinatorial logic. An example of "software" includes executable code in the form of an application, an applet, a routine or even a series of instructions. The software may be stored in any type of machine-readable medium.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting. There are numerous other variations to different aspects of the invention described above, which in the interest of conciseness have not been provided in detail. Accordingly, other embodiments are within the scope of the claims.

What is claimed is:

1. A method comprising:
receiving by a processor a first user input and a first portion of an audio content, wherein the first user input signals to an electronic device to increase or to decrease a volume of a sound output;
determining by the processor a first loudness metric corresponding to the first portion of the audio content when the first user input is received, the first loudness metric being a measure of the loudness of the first portion of the audio content being outputted by the electronic device, wherein determining the first loudness metric includes reading the first loudness metric included in a metadata associated with the first portion of the audio content;
storing by the processor in a memory the first loudness metric in association with the first user input, wherein the memory stores a history of loudness metrics in association with user inputs;
determining by the processor a second loudness metric that is a measure of the loudness of a second portion of the audio content that is received, wherein determining the second loudness metric includes reading the second loudness metric included in a metadata associated with the second portion of the audio content;
determining a second user input associated with the second loudness metric using the history; and
generating by the processor a control signal to automatically control the volume of the sound output by the electronic device corresponding to a second user input.

2. The method of claim 1, wherein determining the first loudness metric to the first portion of the audio content comprises:
receiving from a microphone in a vicinity of the user a microphone signal, and
analyzing the microphone signal to refine the first loudness metric and to determine a first ambient noise level.

3. The method of claim 1, wherein the first user input is an input received on a user input device, wherein the user input device is at one of: a touch screen, a button, and a remote control.

4. The method of claim 1, wherein the history of loudness metrics in association with user inputs includes the first loudness metric in association with the first user input and the second loudness metric in association with the second user input.

5. The method of claim 1, wherein the metadata associated with the first portion of the audio content and the metadata associated with the second portion of the audio content are embedded in the audio content or are included in a metadata channel that is separate from the audio content.

6. The method of claim 1, wherein
determining the first loudness metric comprises analyzing by the processor a sound strength of the first portion of the audio content, and
determining the second loudness metric comprises analyzing a sound strength of the second portion of the audio content.

7. The method of claim 6, wherein
the sound strength of the first portion of the audio content is low when the first portion of the audio content includes one of: no sound, quiet speech, or soft background music, and
the sound strength of the second portion of the audio content is low when the second portion of the audio content includes one of: no sound, quiet speech, or soft background music.

8. The method of claim 6, wherein
the sound strength of the first portion of the audio content is high when the first portion of the audio content includes one of: loud speech, loud background sound effects, or loud background music, and
the sound strength of the second portion of the audio content is high when the second portion of the audio content includes one of: loud speech, loud background sound effects, or loud background music.

9. A non-transitory computer-readable storage medium having stored thereon instructions, which when executed by a processor, causes the processor to perform method comprising:
receiving a first user input and a first portion of an audio content, wherein the first user input signals to an electronic device to increase or to decrease a volume of a sound output;
determining a first loudness metric corresponding to the first portion of the audio content when the first user input is received, the first loudness metric being a measure of the loudness of the first portion of the audio content being outputted by the electronic device, wherein determining the first loudness metric includes reading the first loudness metric included in a metadata associated with the first portion of the audio content;
storing in a memory the first loudness metric in association with the first user input, wherein the memory stores a history of loudness metrics in association with user inputs;
determining a second loudness metric that is a measure of the loudness of a second portion of the audio content that is received, wherein determining the second loudness metric includes reading the second loudness metric included in a metadata associated with the second portion of the audio content;
determining a second user input associated with the second loudness metric using the history; and
generating a control signal to automatically control the volume of sound output by the electronic device corresponding to a second user input.

10. The non-transitory computer-readable storage medium of claim 9, wherein determining the first loudness metric to the first portion of the audio content comprises:
receiving from a microphone in a vicinity of the user a microphone signal, and
analyzing the microphone signal to refine the first loudness metric and to determine a first ambient noise level.

11. The non-transitory computer-readable storage medium of claim 9, wherein the first user input is an input received on a user input device, wherein the user input device is at one of: a touch screen, a button, and a remote control.

12. The non-transitory computer-readable storage medium of claim 9, wherein the history of loudness metrics in association with user inputs includes the first loudness metric in association with the first user input and the second loudness metric in association with the second user input.

13. The non-transitory computer-readable storage medium of claim 9, wherein the metadata associated with the first portion of the audio content and the metadata associated with the second portion of the audio content are embedded in the audio content or are included in a metadata channel that is separate from the audio content.

14. The non-transitory computer-readable storage medium of claim 9, wherein
determining the first loudness metric comprises analyzing a sound strength of the first portion of the audio content, and
determining the second loudness metric comprises analyzing a sound strength of the second portion of the audio content.

15. The non-transitory computer-readable storage medium of claim 14, wherein
the sound strength of the first portion of the audio content is low when the first portion of the audio content includes one of: no sound, quiet speech, or soft background music, and
the sound strength of the second portion of the audio content is low when the second portion of the audio content includes one of: no sound, quiet speech, or soft background music.

16. The non-transitory computer-readable storage medium of claim 14, wherein
the sound strength of the first portion of the audio content is high when the first portion of the audio content includes one of: loud speech, loud background sound effects, or loud background music, and
the sound strength of the second portion of the audio content is high when the second portion of the audio content includes one of: loud speech, loud background sound effects, or loud background music.

17. A system comprising:
a user interface to receive a first user input that signals to an electronic device to increase or to decrease a volume of a sound output;
a memory to store a history of loudness metrics in association with user inputs;
a processor
to receive the first user input and a first portion of an audio content,
to determine a first loudness metric corresponding to the first portion of the audio content when the first user input is received, the first loudness metric being a measure of the loudness of the first portion of the audio content being outputted by the electronic device, wherein determining the first loudness metric includes reading the first loudness metric included in a metadata associated with the first portion of the audio content,
to store in a memory the first loudness metric in association with the first user input,
to determine a second loudness metric that is a measure of the loudness of a second portion of the audio content that is received, wherein to determine the second loudness metric includes to read the second loudness metric included in a metadata associated with the second portion of the audio content,
to determine a second user input associated with the second loudness metric using the history, and
to generate a control signal to automatically control the volume of the sound output by the electronic device corresponding to a second user input.

18. The system of claim 17, further comprising:
an amplifier to receive the control signal from the processor and to apply a gain to the audio content based on the control signal.

19. The system of claim 17, further comprising:
at least one dynamic range compressor to receive the control signal from the processor and to perform dynamic range compression on the audio content based on the control signal.

20. The system of claim 17, further comprising:
a microphone in a vicinity of the user to generate a microphone signal, wherein the processor analyzes the microphone signal to refine the first loudness metric and to determine a first ambient noise level.

21. The system of claim 17, wherein the user interface is included on a user input device, wherein the user input device is at one of: a touch screen, a button, and a remote control.

22. The system of claim 17, wherein the history of loudness metrics in association with user inputs includes the first loudness metric in association with the first user input and the second loudness metric in association with the second user input.

23. The system of claim 17, wherein the metadata associated with the first portion of the audio content and the metadata associated with the second portion of the audio content are embedded in the audio content or are included in a metadata channel that is separate from the audio content.

24. The system of claim 17, wherein
the sound strength of the first portion of the audio content is low when the first portion of the audio content includes one of: no sound, quiet speech, or soft background music, and
the sound strength of the second portion of the audio content is low when the second portion of the audio content includes one of: no sound, quiet speech, or soft background music.

25. The system of claim 17, wherein
determining the first loudness metric comprises analyzing a sound strength of the first portion of the audio content, wherein the sound strength of the first portion of the audio content is high when the first portion of the audio content includes one of: loud speech, loud background sound effects, or loud background music, and
determining the second loudness metric comprises analyzing a sound strength of the second portion of the audio content, wherein the sound strength of the second portion of the audio content is high when the second portion of the audio content includes one of: loud speech, loud background sound effects, or loud background music.

* * * * *